US006330279B1

(12) United States Patent
Belser et al.

(10) Patent No.: US 6,330,279 B1
(45) Date of Patent: Dec. 11, 2001

(54) SYSTEM AND METHOD OF CORRECTING GAIN AND OFFSET ERROR IN A SIGNAL AMPLIFIER FOR A POSITION SENSITIVE DETECTOR

(75) Inventors: Karl A. Belser; Stephen J. Hrinya, both of San Jose; Max Artusy, Saratoga, all of CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/111,636

(22) Filed: Jul. 7, 1998

Related U.S. Application Data

(60) Provisional application No. 60/073,875, filed on Feb. 6, 1998.

(51) Int. Cl.[7] ........ H04K 7/08

(52) U.S. Cl. ........ 375/238; 356/375

(58) Field of Search ........ 375/237, 238; 332/109; 356/3.04, 375; 327/31, 172, 175; 370/205, 212; 329/312

(56) References Cited

U.S. PATENT DOCUMENTS 4,591,810 * 5/1986 Mackenzie et al. ........ 332/109
4,914,396 * 4/1990 Berthiaume ........ 327/106
5,082,363 * 1/1992 Nakanishi et al. ........ 356/3.04
5,453,921 * 9/1995 Shutts ........ 363/21
5,936,457 * 8/1999 Liao et al. ........ 327/514
6,122,061 * 9/2000 Pilone et al. ........ 356/375

FOREIGN PATENT DOCUMENTS

0442209 * 2/1990 (EP) ........ H03K/7/08
WO 98/26501 * 6/1998 (WO) ........ H03F/3/217

* cited by examiner

*Primary Examiner*—Stephen Chin
*Assistant Examiner*—Chieh M. Fan
(74) *Attorney, Agent, or Firm*—Shawn B. Dempster; Jonathan E. Olson; Kirk A. Cesari

(57) ABSTRACT

A system and method is disclosed for correcting gain and offset errors in a signal amplifier for a position sensitive detector. The present invention eliminates the need to perform division for normalization by holding constant a signal proportional to the sum of the two signals generated by the position sensitive detector. First the two signals generated by the position sensitive detector are pulse-width modulated with a common variable duty cycle clock, and then the resulting modulated signals are low-pass filtered to extract the DC component. The duty cycle is varied so that the sum of the two DC components is held constant. In the preferred embodiment, the means for varying the duty cycle are closed-loop feedback and open-loop feed forward. The closed-loop feedback gives long term accuracy and the open-loop feed forward gives rapid settling time. Once the sum of the DC components of the modulated signals is held constant, the individual DC components of the modulated signals are normalized and may be used for servo or other applications.

22 Claims, 10 Drawing Sheets

SYSTEM AND METHOD OF CORRECTING GAIN AND OFFSET ERROR IN A SIGNAL AMPLIFIER FOR A POSITION SENSITIVE DETECTOR

CROSS REFERENCE TO RELATED APPLICATIONS

This application is related to and claims the benefit of commonly assigned U.S. Provisional Application No. 60/073,875, filed on Feb. 6, 1998 and entitled "Method And System Of Correcting Gain And Offset Error In A Signal Amplifier For A Position Sensitive Detector." The subject matter of this related application is incorporated herein by reference.

BACKGROUND OF THE INVENTION

1. Field of the Invention

This invention relates generally to optical position sensing and more specifically to an improved signal amplifier for a solid-state position sensitive detector.

2. Description of the Background Art

Accurate position sensing is needed in such diverse fields as robotics and disk drives. Typically the problem arises in automatic control of structures, when an element of the structure is moved by some kind of motor. Servo systems compare the desired position of the structure with the measured position of the structure, and using this difference information supply more or less power to the motor. For this kind of servo system to work the measured position must be known to great accuracy.

Optical measuring systems are attractive in servo controlled systems because they do not introduce friction into the systems. Such friction could negate carefully designed critically-damped systems and cause either slow response or oscillation about the desired position. A typical prior art optical measuring system is shown in FIG. 1. Here the rotational position of arm 110 about pivot 112 is to be measured by light supplied by light source 100. Light source 100 may be a laser or some other collimated light source. The incident beam 104 from light source 100 is reflected by reflector 114. Reflector 114 is shown as a mirror but alternatively may be a beam splitter. As arm 110 pivots about pivot 112, angle A changes and the reflected beam 106 traverses a series of photodiodes 120 through 136. Depending upon which photodiode 120–136 is illuminated by reflected beam 106, the angle A of arm 110 is approximately known.

The device shown in FIG. 1 has the drawback of low positional resolution. The position of arm 110 is known only to a resolution depending upon the size and spacing of the photodiodes 120–136. Smaller photodiodes which are more closely spaced will yield higher resolution, but there is a limit to the practical size and spacing of discrete photodiodes. In addition, each photodiode has an anode and a cathode lead. Biasing and sensing a large number of individual photodiodes adds unwelcome complexity to the device.

A special kind of photodiode called a position sensitive detector (PSD) offers improved resolution and accuracy over the use of many discrete photodiodes. FIG. 2 shows the device of FIG. 1 where the individual photodiodes 120–136 have been replaced by a single PSD 210. The PSD 210 is a photodiode with an anode of width L. The PSD 210 has a common cathode 212 and a pair of anode connections, anode A 214 and anode B 216, attached at opposite ends of the anode of width L. The distance x from the center of PSD 210 of an illuminating spot produced by reflected beam 106 may be calculated by measuring the relative currents flowing in anode A 214 and anode B 216. The continuous anode of the PSD allows measuring resolution and accuracy to 1 part in 10,000 if coupled to a sensing amplifier of sufficient accuracy.

FIG. 3 shows a schematic symbol for a PSD. PSD 300 comprises a common cathode attachment 310 and a pair of anode attachments, anode A 312 and anode B 314. The schematic symbol for the PSD 300 also shows a schematic representation of incident light 316. When the PSD is reverse biased with voltage Vcc, a current Io flows depending upon the intensity of the incident light.

PSD 300 has the property that Io is dependent only on the intensity of the incident light and not on its position along the long anode. Currents $I_A$ and $I_B$ flow in anode A 312 and anode B 314, respectively. By current junction law, $I_O=I_A+I_B$, and therefore the sum $(I_A+I_B)$ is also dependent only on the intensity of the incident light and not on its position.

In FIG. 4 a schematic diagram for a prior art sensing amplifier and servo driver circuit using Gilbert cells is shown. The use of the 2-quadrant Gilbert cell for performing analog multiplications and divisions is well known in the art. In the FIG. 4 schematic, PSD is connected to an integrated circuit model AD880 (402), containing the Gilbert cells, manufactured by Analog Devices, Inc. The AD880 (402) has a sum output node 404 which may be used for laser power control, and a normalized difference servo output node 406 which yields the relative distance from the center of PSD 400 (as shown for PSD 210 in FIG. 2). In the FIG. 4 application, the position information is used for servo control over that position. The desired position is entered as digital data 412 into an inverted-output digital-to-analog converter (DAC) 410. The inverted analog output 414 of the DAC 410 is added to the non-inverted signal from the normalized servo output node 406 by lead/lag compensation circuit 420. Lead/lag compensation circuit 420 contains a summing operational amplifier (op amp) 422 whose output is zero if the measured position is the same as the desired position, and gives a correction signal otherwise. The output of lead/lag compensation circuit 420 is the input of servo control circuit 440. Servo control circuit 440 drives the arm control motor 450 in proportion to the correction signal from lead/lag compensation circuit 420. Servo control circuit 440 contains a current source op amp 442 and a current sink op amp 444 whose outputs at the current source node 446 and current sink node 448 send currents through the windings of arm control motor 450, keeping the arm in the desired position which was entered as digital data 412.

The primary shortcoming of the prior art circuit of FIG. 4 is the error induced by the analog divisions performed by AD880 (402). The observed error with this circuit is 1 part in 100, far below the 1 part in 10,000 intrinsic to the PSD 400.

In FIG. 5 a schematic diagram for a prior art sensing amplifier using gain control on the incident laser power is shown. In the FIG. 5 circuit the need for analog division is removed by controlling the illumination intensity from the laser 502 incident upon PSD 500. If the illumination intensity incident upon PSD 500 is a constant, then the sum of the anode currents $(I_A+I_B)$ will be a constant, eliminating the need for normalization and the analog division errors induced thereby. The FIG. 5 circuit converts the PSD 500 anode currents into voltages with A buffer op amp 510 and B buffer op amp 512. The signals at voltage A node 514 and voltage B node 516 are added with analog adder 520 to yield a signal at A+B node 532 proportional to the incident intensity on PSD 500. Using this signal on A+B node 532, automatic gain control (AGC) circuit 534 sends a signal on AGC node 536 which adjusts the laser power controller 504 and thereby the laser 502 power output.

In other aspects, the circuit of FIG. 5 is equivalent to that of FIG. 4. The desired position is entered as digital input 528 to DAC 526, producing a desired position voltage on the analog output 524 of DAC 526. The A and B signal voltages are subtracted in analog subtractor 518 and compared with the desired position voltage using analog subtractor 530. The output of subtractor 530 is the input to the servo control circuit (not shown) which is identical to the servo control circuit 440 of FIG. 4.

The AGC circuit 534 control over laser 502 power output holds the incident light intensity on PSD 500 constant so that error-inducing normalization by division is not required. The circuit of FIG. 5 eliminates much of the error induced in the circuit of FIG. 4, but with the newly added limitation that the laser 502 power cannot be varied for other system requirements. In many applications, the laser's power needs to vary over a wide range, such as in the case of a read/write optical or magneto-optical disk drive. In such a case the positions of head positioning arms or fibers in a fiber-optic switch need to be controlled to high accuracy, and preferably using the same laser light source used to read and write from the disk. Using a beam-splitter, part of the incident laser light may be used for reading and writing from the disk while a small amount is available for position sensing. But in a read/write optical or magneto-optical disk the ratio of laser intensity for reading versus writing may be 1 to 10.

Therefore there exists a need for a system and a method for amplifying the outputs of a PSD which eliminates the errors created in the circuit shown in FIG. 4 and which does not require the limitation on laser intensity required by the circuit shown in FIG. 5.

SUMMARY OF THE INVENTION

In accordance with the present invention, a system and method are disclosed for correcting gain and offset errors in a signal amplifier for a position sensitive detector. A position sensitive detector has an intrinsic accuracy of 1 part in 10,000. In the prior art this had been reduced to 1 part in 100 due primarily to errors induced by the sensing amplifier's analog division, performed during the process of normalizing the position measurements. The present invention eliminates the need to perform the division by holding constant a signal, proportional to the sum of the two signals, generated by the position sensitive detector.

The method of holding the signal constant has two primary steps. The first step pulse-width modulates the two signals generated by the position sensitive detector anodes with a common variable-duty-cycle clock, and the second step low-pass filters the resulting modulated signals to extract the DC component. The duty cycle is varied so that the sum of the two DC components is held constant. In the preferred embodiment, the means for varying the duty cycle are closed-loop feedback and open-loop feed forward. These means are used at different times. The closed-loop feedback gives long term accuracy and the open-loop feed forward gives rapid settling time. Once the sum of the DC components of the modulated signals is held constant, the individual DC components of the modulated signals are normalized and may be used for servo or other applications.

Two alternate embodiments are disclosed for implementing the open-loop feed forward in the case when the light source incident upon the position sensitive detector has two discrete levels. In the first embodiment a digital counter saves digital representations of a previous duty cycle derived by feedback for the two intensity levels. This digital representation may be converted to analog form by a digital-to-analog converter when needed. The second embodiment switches the gain of the input transconductance amplifier between two fixed gains so that the sum of the resulting signals has a constant amplitude.

DETAILED DESCRIPTION OF THE PREFERRED EMBODIMENT

The present invention relates to correcting gain and offset errors in a signal amplifier. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention comprises a system and method for correcting gain and offset errors in a signal amplifier for a position sensitive detector. This invention eliminates the errors arising in normalization by analog division and furthermore is applicable to systems where the intensity of the incident light changes over a wide range. The essence of the present invention is pulse-width modulating the signals $I_A$ and $I_B$ coming out of the two anodes of the PSD by gating them with a clock of variable duty cycle. This yields a pulse train whose amplitude is that of the incoming signals and whose duty cycle is the same as the gating clock. The duty cycle is varied so that the DC value of $I_A+I_B$, extracted by low-pass filters, is held constant over a wide range of incident light intensity. Since $I_A+I_B$ is held constant, normalization is not required and the errors arising from analog division are eliminated.

In the preferred embodiment, the $I_A$ and $I_B$ signals are buffered and then returned to current mode for gating in the pulse-width modulators. This use of current mode allows faster switching and therefore a simpler low-pass filter design. In the preferred embodiment, the gating clock operates at 1 MHz for signals of interest in the 10 KHz range.

Figure 6:
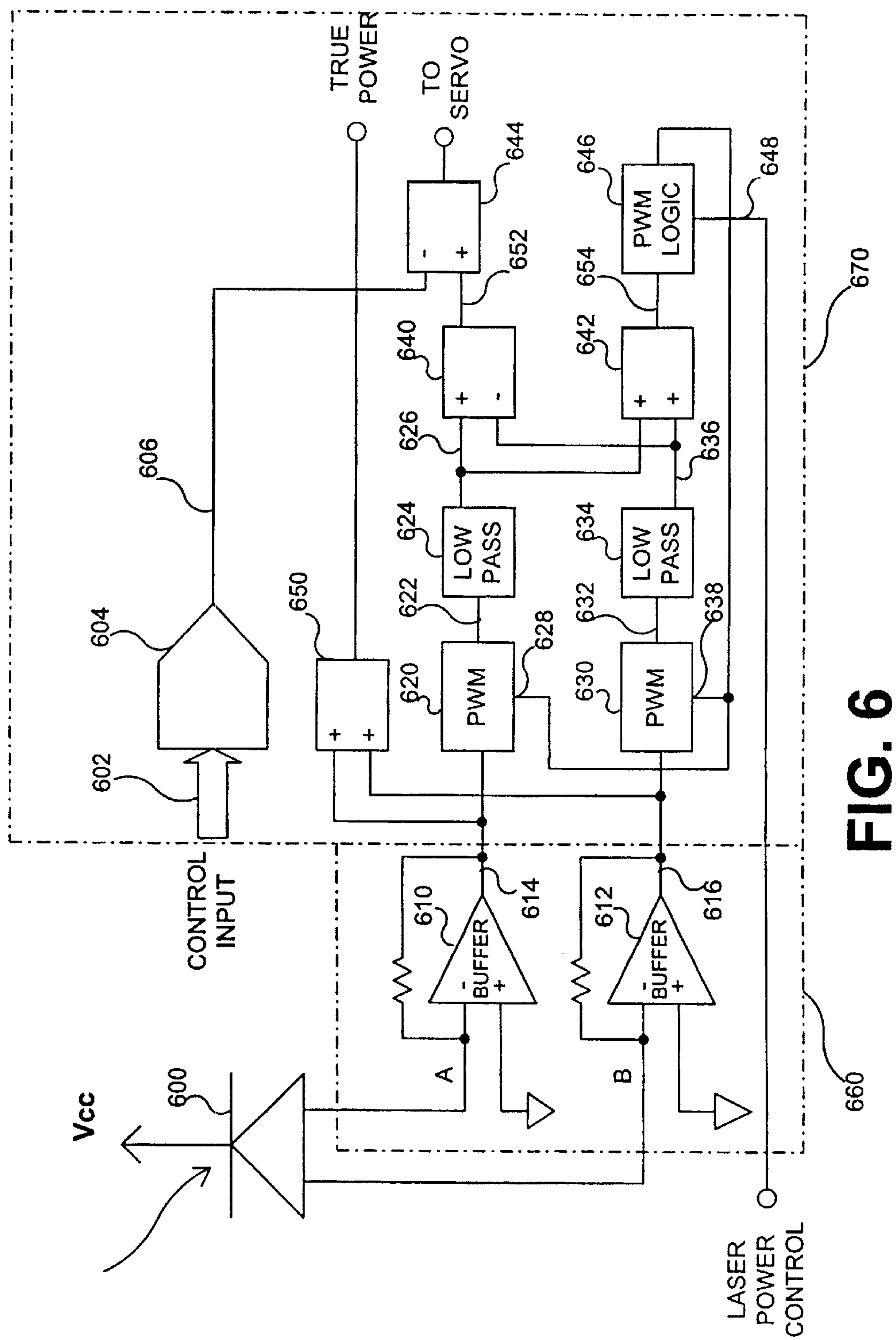
FIG. 6 is a simplified schematic diagram for a sensing amplifier using pulse-width modulation, according to the present invention.

Referring to FIG. 6, a simplified schematic diagram for a sensing amplifier using pulse-width modulation is shown, according to the present invention. In the preferred embodiment of the present invention shown in FIG. 6, a spot of laser light of varying intensity strikes PSD 600 somewhere along the anode. The resulting $I_A$ and $I_B$ signals are buffered by A buffer op amp 610 and B buffer op amp 612. The resulting signal voltages at node 614 and node 616 may be added by analog adder 650 to yield a signal proportional to the incident laser light intensity. More importantly, the resulting signal voltages at node 614 and node 616 enter pulse-width modulators (PWM) A PWM 620 and B PWM 630, respectively, where they are modulated by a variable-duty-cycle clock entering at A PWM clock input 628 and B PWM clock input 638. The A and B signals gated in the PWM circuits may be represented either by voltages or by currents, but in the preferred embodiment they are represented by currents to allow faster switching. After being pulse-width modulated, the DC values of the modulated currents at A PWM output node 622 and B PWM output node 632 are extracted by A low-pass filter 624 and B low-pass filter 634. These DC values are expressed as voltages corresponding to (modulated $I_A$) and (modulated $I_B$) at A filter output node 626 and B filter output node 636, respectively.

When summed in analog adder 642, the DC component of modulated ($I_A+I_B$) is used to control PWM logic 646. If the DC component of modulated ($I_A+I_B$) is greater than a fixed constant set point, then PWM logic 646 lowers the duty cycle of its output clock signal: if less than the fixed constant set point, then PWM logic 646 raises the duty cycle of its output signal. In this manner, using feedback, the DC component of modulated ($I_A+I_B$) is held constant.

In cases where the value of ($I_A+I_B$) varies suddenly, there will be a prolonged settling time when only the closed-loop feedback mechanism described above is used. In many such cases, for example when the read/write laser in an optical disk is switched from read to write mode, the sudden change may be predictable. Therefore, the preferred embodiment of the present invention may adjust the duty cycle of the PWM clock with open-loop feed forward. This may take the form of sending either a digital or an analog laser power control signal on feed forward node 648 to PWM logic 646. The laser power control signal will directly adjust the duty cycle of the PWM clock to an estimated value appropriate to the new changed value of ($I_A+I_B$). The use of open-loop feed forward will greatly shorten settling times subsequent to rapid changes in the values of ($I_A+I_B$).

Figure 1:
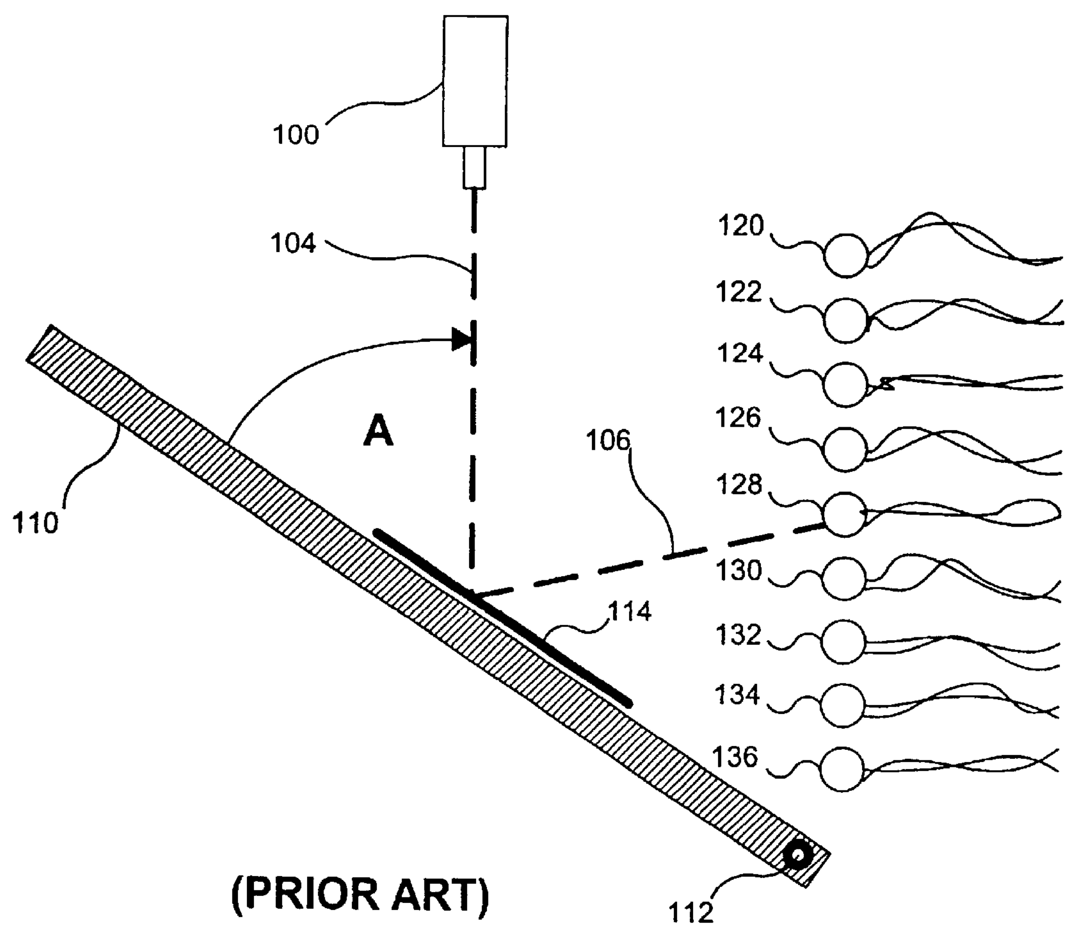
FIG. 1 is a layout drawing, showing position sensing using discrete photodiodes.
Figure 2:
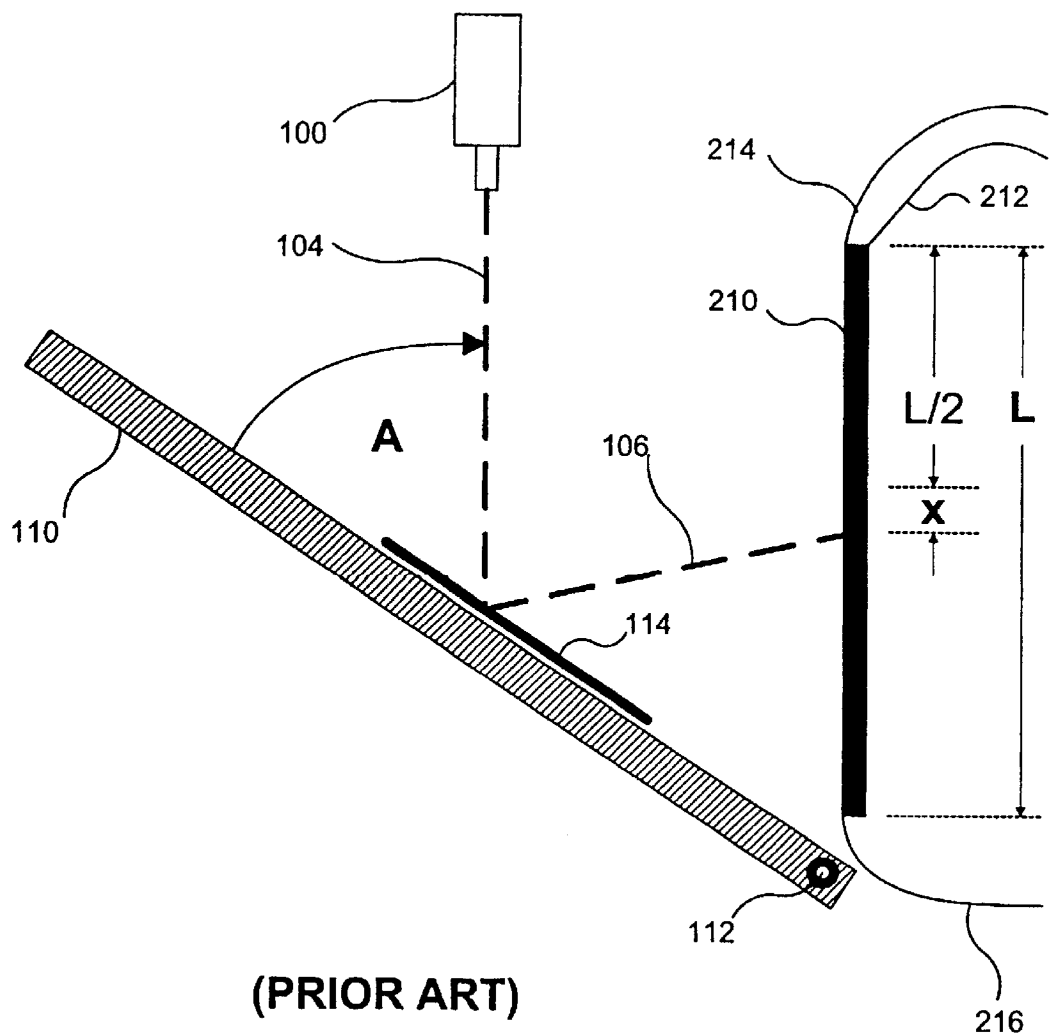
FIG. 2 is a layout drawing, showing position sensing using a position sensitive detector.
Figure 3:
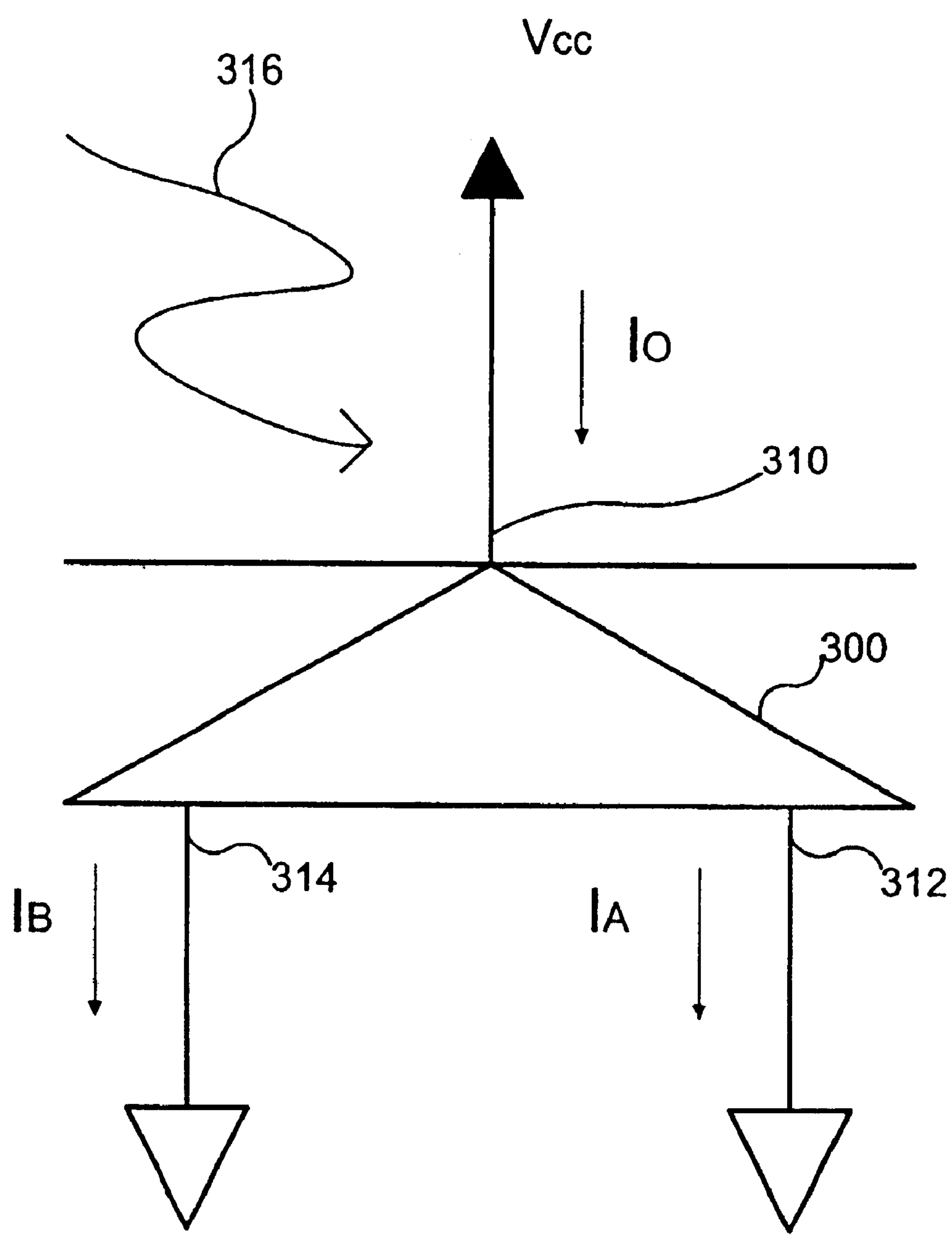
FIG. 3 is a schematic symbol for a position sensitive detector.
Figure 4:
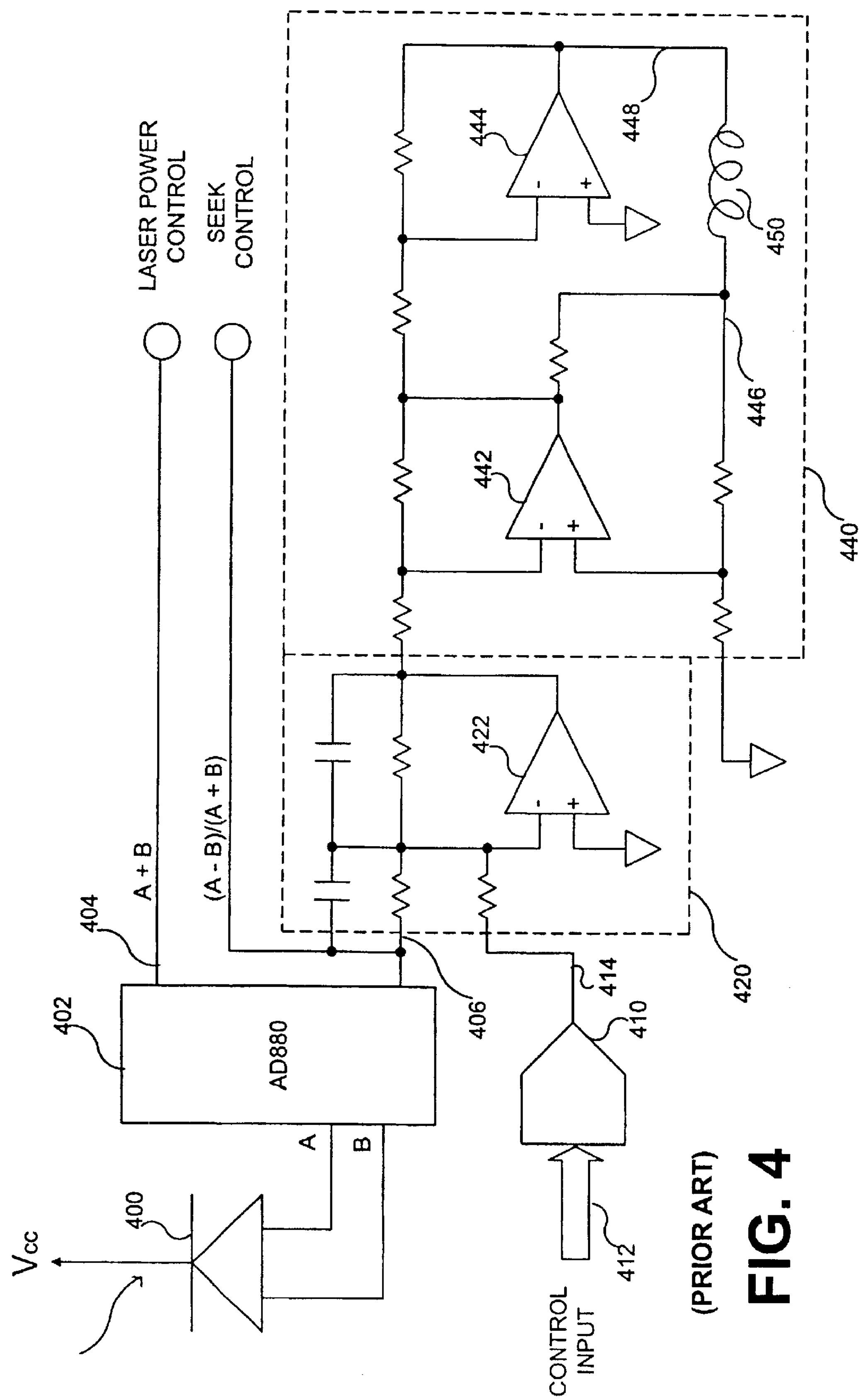
FIG. 4 is a schematic diagram for a prior art sensing amplifier and servo driver circuit using Gilbert cells.
Figure 5:
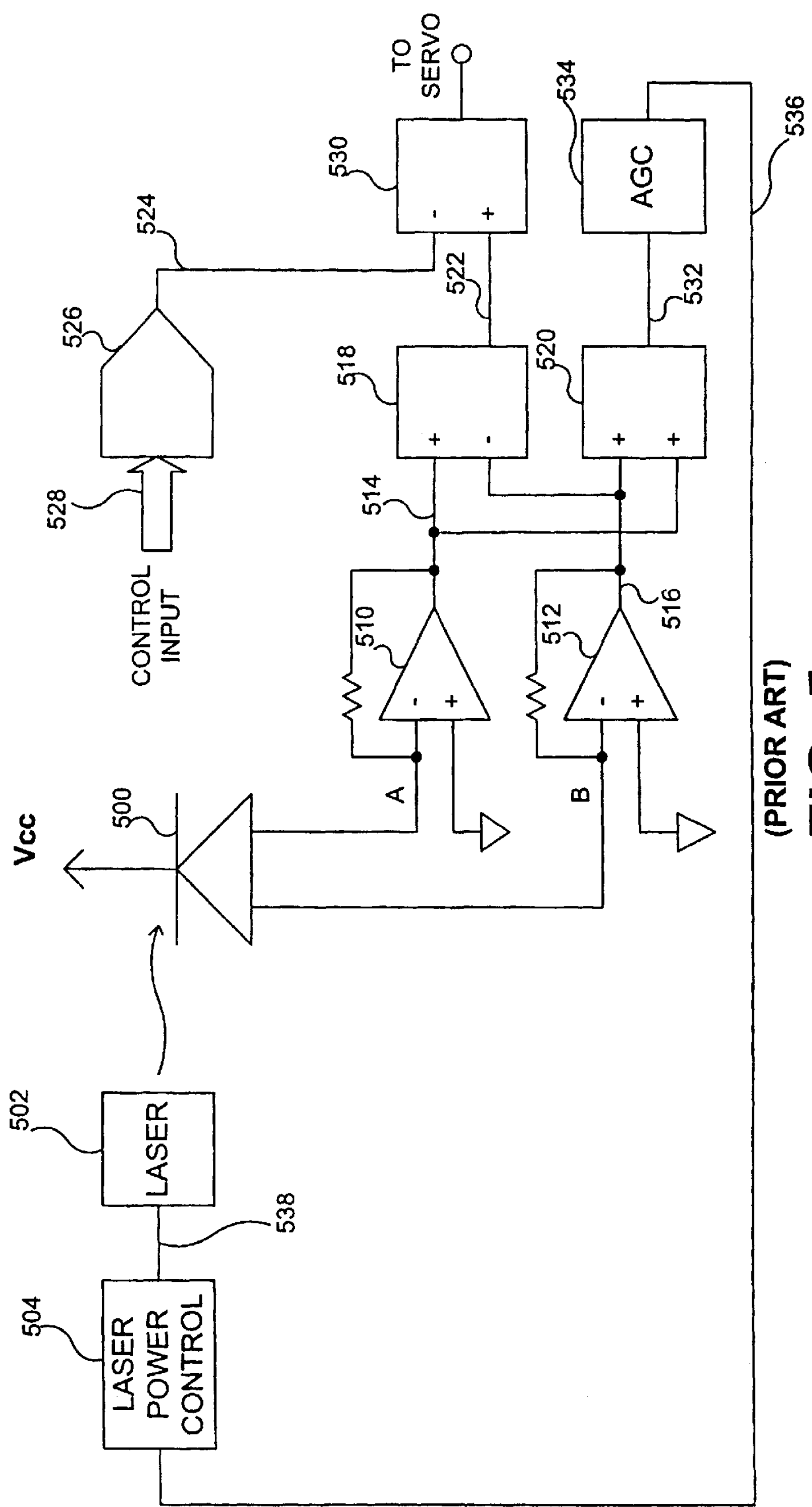
FIG. 5 is a schematic diagram for a prior art sensing amplifier using gain control on the incident laser power.

The DC value of modulated ($I_B$), available at B filter output node 636, may be subtracted from the DC value of modulated ($I_A$), available at A filter output node 626, using analog subtractor 640. Because the DC value of modulated ($I_A+I_B$) is held constant with feedback and feed forward, as described above, the signal on (A–B) node 652 is already normalized. No error inducing analog division of the signals is required. The signal on (A–B) node 652 may then have subtracted from it the desired position control signal on analog output 606 of DAC 604. This subtraction takes place in analog subtractor 644, whose output may be used to drive a servo control circuit such as servo control circuit 440 described above in the discussion of FIG. 4.

Figure 7:
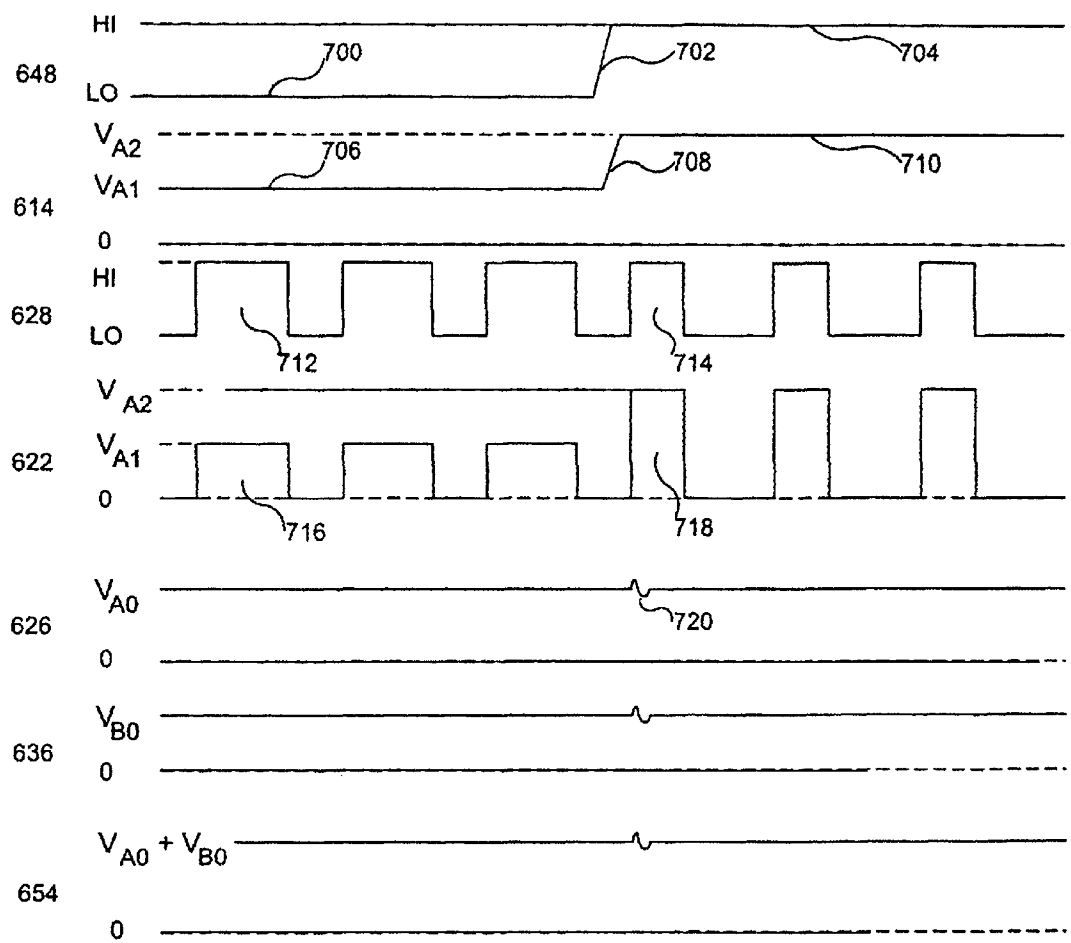
FIG. 7 is a timing diagram for the circuit shown in FIG. 6, according to the present invention.

Referring now to FIG. 7, a timing diagram for the circuit shown in FIG. 6 is shown, according to the present invention. For the purpose of illustration, the FIG. 7 timing diagram shows the response to a sudden but predictable change in the intensity incident upon PSD 600 caused by switching the laser power control signal from read mode to write mode. This signal is shown as a digital signal, although in alternate embodiments it may be an analog signal. The first signal shown in FIG. 7 is that of feed forward node 648. The signal starts at logic LO level during the time of feed forward low 700. At feed forward transition 702 the signal increases to feed forward high 704 level, which results in increase of the intensity of the laser light incident upon PSD 600. The corresponding anode currents increase, as shown by the signal voltage at A buffer node 614. Here (in voltage form) buffered A low 706 rises at buffered A transition 708 to buffered A high 710 in response to the increased intensity.

Before the time of transition, the logic level signal at A PWM clock input 628 is represented by logic pulse duty cycle 1 (712). When the buffered A low 706 signal is pulse-width modulated with logic pulse duty cycle 1 (712), the result at A PWM output node 622 is buffered A low at duty cycle 1 (716). Using open-loop feed forward, the PWM logic 646 narrows the width of the first pulse occurring after feed forward transition 702 to be logic pulse duty cycle 2 (714). When the buffered A high 710 signal is pulse-width modulated with logic pulse duty cycle 2 (714), the result at A PWM output node 622 is buffered A high at duty cycle 1 (718). In buffered A high at duty cycle 2 (718), the greater amplitude is offset by the narrower pulse. Thus when the signal at A PWM output node 622 is sent through A low-pass filter 624, the extracted DC value of modulated ($I_A$) at A filter output node 626 will be a constant value $V_{AO}$. Only at the time near to feed forward transition 702 will there be a transitory mistracking 720. The same analysis applies to the signal at B filter output node 636. Hence the sum of the signals at the output of analog adder 642, (A+B) node 654, is held constant except for short transitory effects.

Figure 8:
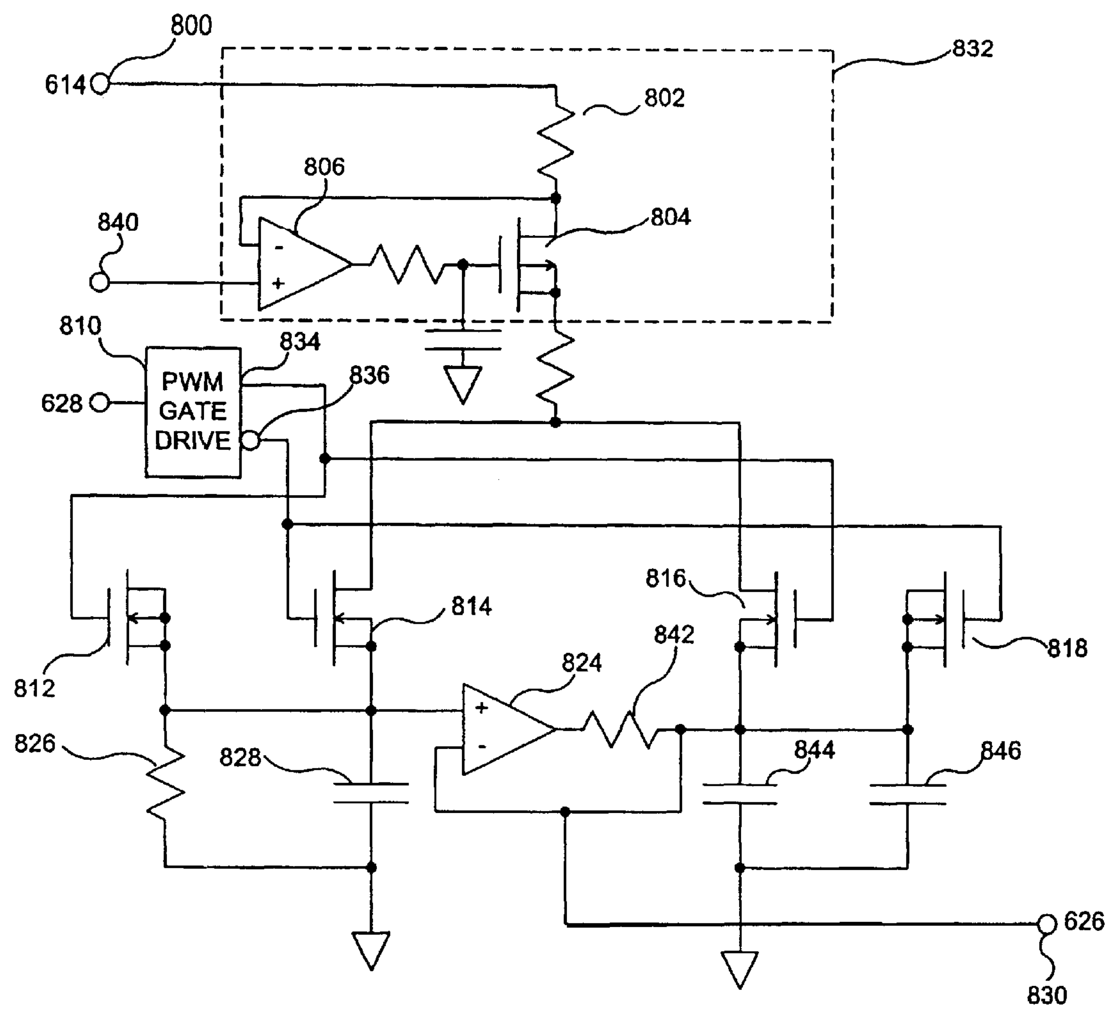
FIG. 8 is a detailed schematic diagram for the pulse-width modulator and low-pass filter shown in FIG. 6, according to the present invention.

Referring now to FIG. 8, a detailed schematic diagram for the pulse-width modulator and low-pass filter shown in FIG. 6 is shown, according to the present invention. The circuit shown in FIG. 8 corresponds to the preferred embodiment of functional blocks A PWM 620 and A low-pass filter 624 (or equally to the B signal blocks). For the purpose of illustration, references are to the A signal blocks.

Buffered A input 800 signal from A buffer node 614 is converted from voltage to current in voltage-to-current circuit 832. The non-inverting input of op amp 806 is connected to a pseudo-ground node 840. Op amp 806 drives the gate of metal-oxide-semiconductor field-effect transistor (MOSFET) 804 so that the drain-source current in MOSFET 804 is equal to the current flowing through resistor 802. The value of this current is (voltage at A buffer node)/R, where R is the value of resistor 802.

MOSFETs 814, 816 alternately carry the current from voltage-to-current circuit 832, thus performing the pulse-width modulation. The gates of MOSFETs 814, 816 are driven by the inverting output 836 and noninverting output 834 of PWM gate driver 810. The signals at inverting output 836 and non-inverting output 834 are derived from the PWM clock signal generated by PWM logic 646, but are not true logical complements. When either one of the signals makes a transition from logic HI to logic LO, the complementary signal is delayed a few nanoseconds before making the logic LO to logic HI transition. In this manner the MOSFETs 814, 816 are never simultaneously turned on, thus preventing a spurious feedback path of buffering op amp 824 through the drains of the two MOSFETs 814, 816.

In the case when the circuit of FIG. 8 is realized with discrete components, MOSFETs 812, 814, 816, and 818 are preferably matched in a monolithic four MOSFET array. Dummy circuit element MOSFETs 812 and 818 compensate for the drain-gate and source-gate capacitances in active MOSFETs 814 and 816. Buffer op amp 824 forms an active low-pass filter in conjunction with resistor 826, capacitor 828, resistor 842, and capacitors 844 and 846. As mentioned above, the PWM clock is preferably running at about 1 MHz. This simple low-pass filter may thus extract the DC component of the modulated A signal. The DC value output 830 is available at A filter output node 626.

Figure 9:
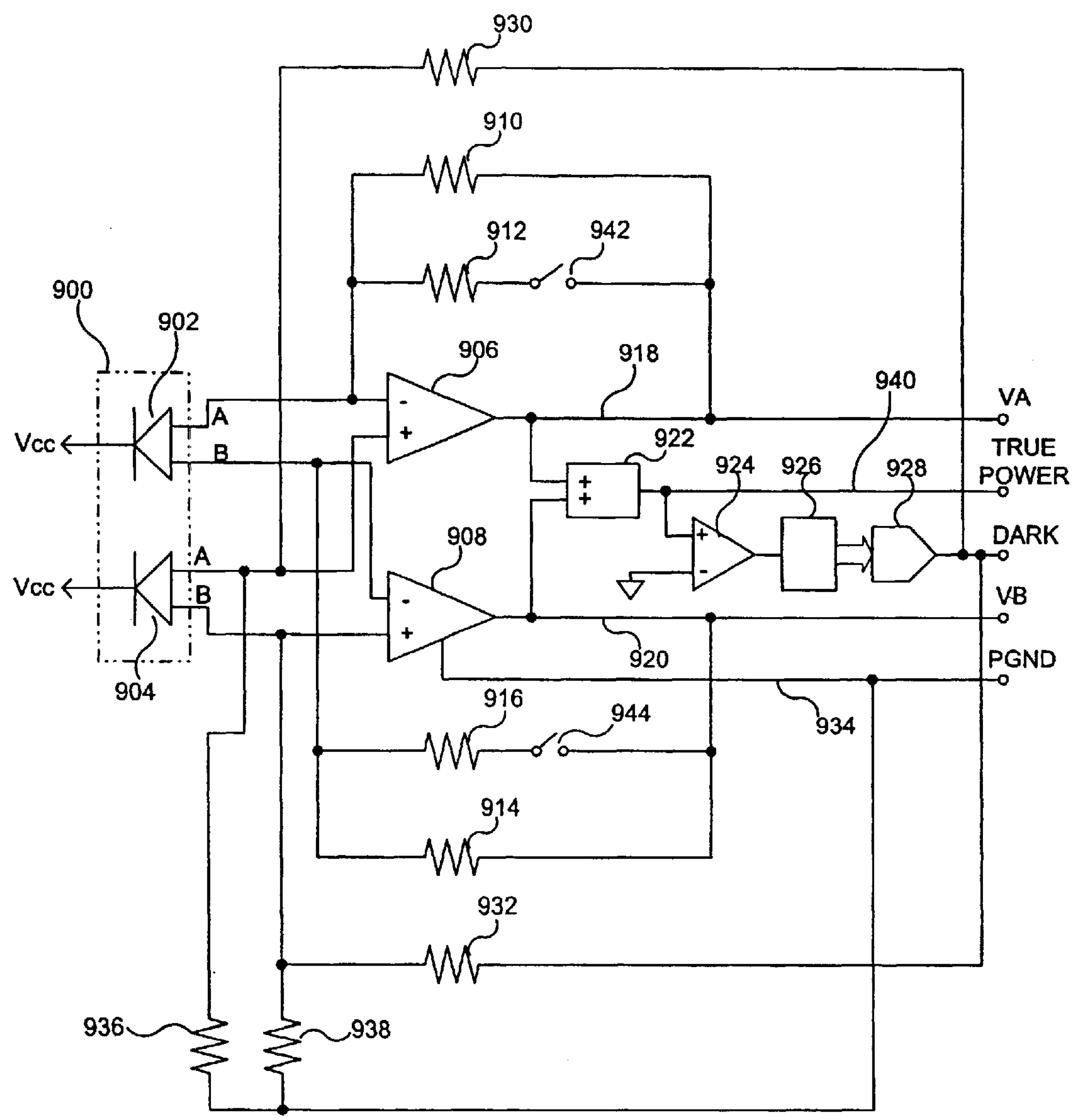
FIG. 9 is a schematic diagram for a transimpedance amplifier with dark-current cancellation and gain switching, according to the present invention.

Referring now to FIG. 9, a schematic diagram for a transimpedance amplifier with dark-current cancellation and gain switching is shown, according to the present invention. The circuit of FIG. 9 corresponds generally to the transconductance amplifier 660 of FIG. 6. As is true for all semiconductor diodes, reverse-biased PSDs have some current flow even with no incident light. This spurious current is called the dark-current. In order to obtain the highest positional accuracy from a PSD, the effects of this dark-current must be removed from the true signals. In the preferred embodiment, the dark-current is compensated by two methods. One is to use a dummy PSD shielded from the light, whose only current is therefore the dark-current. The other method is to periodically sample the PSD current when the light is turned off and use this value in feedback to remove the dark-current effects. Both are shown in the circuit of FIG. 9.

In the circuit of FIG. 9, PSD assembly 900 contains an active PSD 902 and a dummy PSD 904 mounted on a common heatsink. The active PSD 902 and dummy PSD 904 should be closely matched to remove process effects, while the common heatsink removes temperature effects. The A op amp 906 subtracts the A dark-current generated by dummy PSD 904 from the overall A current generated by active PSD 902, yielding a dark-current compensated signal at buffered A node 918. B op amp 908 functions similarly to remove the B dark-current.

Analog adder 922 sums the voltages on buffered A node 918 and buffered B node 920. This sum is available as the true power signal for use elsewhere in the system. During periods of time when the laser is turned off, the sum voltage available on (A+B) node 940 will represent only dark-current effects. This voltage can be compared with ground using a digital comparator 924, whose output can be used to increment or decrement digital counter 926 under software control. The output of digital counter 926 will remain constant during the periods of time when the laser is turned on. DAC 928 may then be used to generate a signal voltage, representing the dark-current, for use in feedback control of op amps 906 and 908. For this circuit to operate correctly, the four resistors 910, 914, 936, and 938 must be matched within about 0.1%, as must the two resistors 912 and 916.

The circuit shown in FIG. 9 also shows one embodiment of an open-loop feed forward mechanism for achieving lower circuit settling times. When the laser light is anticipated to have two distinct values of intensity (e.g. read and write), A feedback resistor 910 and B feedback resistor 914 may be chosen to yield a nominal 50% duty cycle of the PWM clock during such times when the light is at the lower intensity value. The A gain lowering resistor 912 and B gain lowering resistor 916 may be chosen to yield a nominal 50% duty cycle of the PWM clock when the light is at the higher intensity value and when switches 942, 944 are closed under software or hardware control. In the preferred embodiment of the present invention switches 942, 944 may be closed by the signal which increases laser power, the write gate signal, when enabled by a software-driven register.

Figure 10:
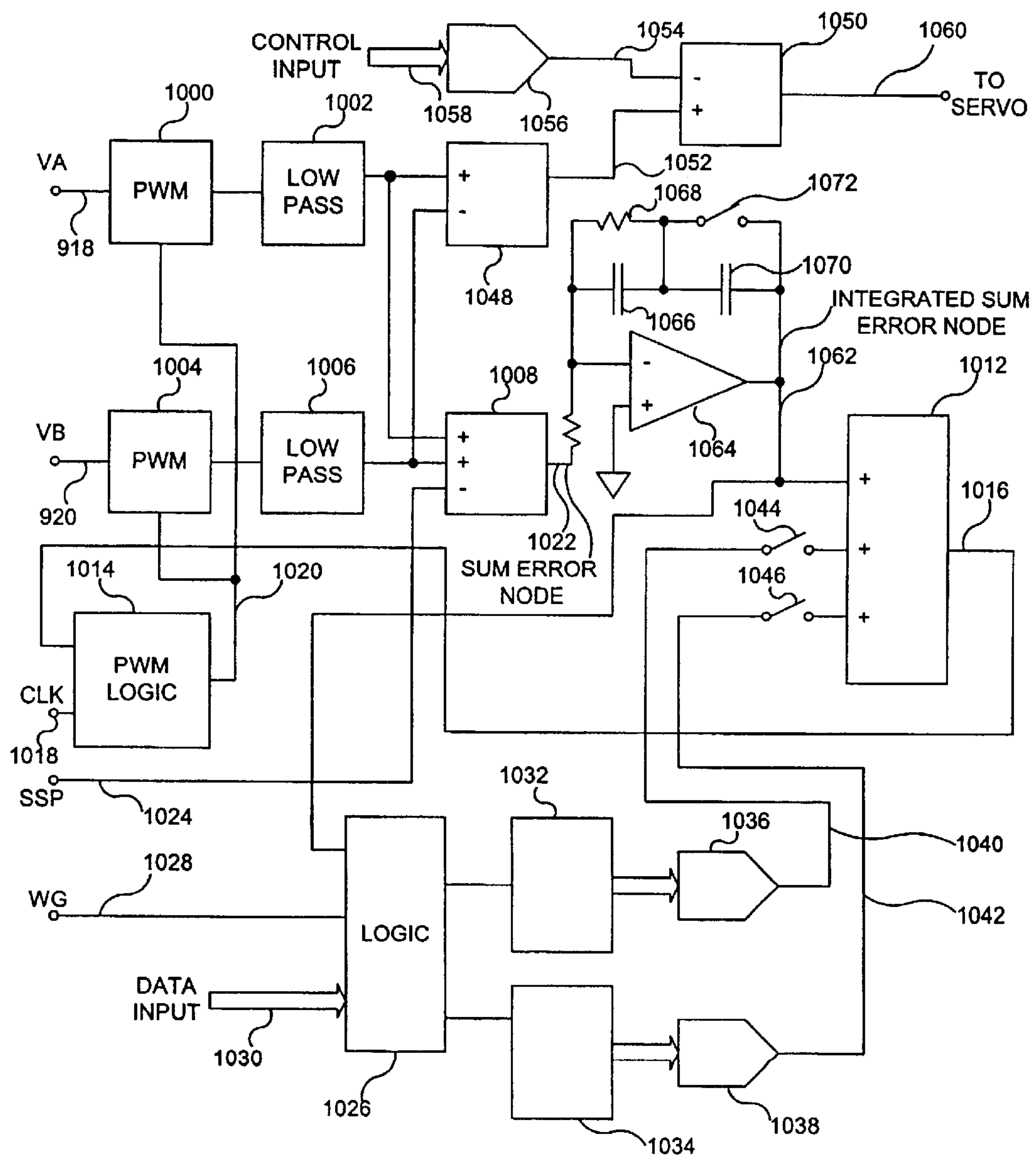
FIG. 10 is a schematic diagram for a pulse-width modulation normalization circuit, according to the present invention.

Referring now to FIG. 10, a schematic diagram for a pulse-width-modulation normalization circuit is shown, according to the present invention. The circuit of FIG. 10 corresponds generally to the PWM normalization circuit 670 of FIG. 6. Details of circuit elements A PWM 1000 and A low-pass filter 1002, or alternately B PWM 1004 and B low-pass filter 1006, are similar to those discussed above in respect to FIG. 8.

A target value for the DC component of modulated (A+B) is generated, called the "sum set point" on sum set point node 1024. The sum set point is subtracted from the measured DC component of modulated (A+B) in analog summing amplifier 1008. The resulting signal, called "sum error" on sum error node 1022, is integrated by lead/lag amplifier 1064 with feedback capacitor 1066, resistor 1068, and integrating capacitor 1070. Switch 1072 shorts out the integrating capacitor 1070 when closed, and therefore switch 1072 may reset and initiate the integration process under software control. In the preferred embodiment, switch 1072 is controlled by logic 1026 and may close momentarily at those times when the laser power is switched from one power setting to the other. The output signal of lead/lag amplifier 1064 is called the "integrated sum error" on integrated sum error node 1062.

During periods of closed-loop feedback, the value of the sum error signal will approach zero volts. The integrated sum error signal is sent into analog summing amplifier 1012. There the integrated sum error signal may be added to nominal value signals (described below) before being sent on PWM logic control signal node 1016 to PWM logic 1014.

In the preferred embodiment PWM logic 1014 takes the free-running clock 1018 signal and derives a sawtooth wave of equal time period. This sawtooth wave is compared with a voltage level derived from PWM logic control signal node 1016 in a voltage comparator, whose output is a squarewave of varying duty cycle on PWM clock 1020.

In the preferred embodiment, integrated sum error signal on integrated sum error signal node 1062 may also be used to generate feed forward signals to allow rapid settling of the PWM clock 1020 after switching from one level of laser power to another. The integrated sum error signal enters logic 1026 at a comparator whose other input is at a predetermined set point, corresponding to a sum error of zero. In the case when the laser is in the lower intensity (e.g. read) mode, and when software has enabled logic 1026 via data input node 1030, nominal read counter 1034 may be incremented or decremented depending upon whether integrated sum error signal is below or above the comparator set point, respectively. The output of nominal read counter 1034 is changed to an analog form by the nominal read DAC 1038 and may be routed through switch 1046 and analog summing amp 1012 to control the duty cycle of PWM clock 1020 generated by PWM logic 1014. The nominal read counter value is determined during a read operation after the circuit of FIG. 10 is first powered on. Feedback through logic 1026, incrementing or decrementing the value in nominal read counter 1034, will generate a signal via nominal read DAC 1038 that will cause the integrated sum error signal to reach essentially zero volts. At this point the nominal read counter 1034 contains a digital representation of the nominal signal voltage which, when applied to PWM logic 1014, will keep modulated (A+B) a constant. This digital representation of the nominal signal voltage will remain in nominal read counter 1034 and may be used at such future time when the laser power is switched from write to read. At such time, if commanded by software writing over data input 1030 to logic 1026, the digital representation of the nominal signal voltage may be converted to analog form by nominal read DAC 1038 and applied through switch 1046 and analog summing amplifier 1012 to PWM logic 1014. This will allow PWM logic 1014 to present a best estimate of the appropriate duty cycle to supply the A PWM 1000 and the B PWM 1004 to allow them to keep modulated (A+B) a constant, and thus minimize the settling time to the final duty cycle.

Logic 1026, nominal write counter 1032, nominal write DAC 1036, and switch 1046 may perform similar feed forward functions for the case when the laser is in write mode. Again the feedback upon power on will create a value to be saved in nominal write counter 1032 for use later when the laser is switched from read mode to write mode. Logic 1026 may additionally contain circuits for controlling the digital counter 926 and switches 942, 944 of FIG. 9 in response to software commands.

The invention has been explained above with reference to a preferred embodiment. Other embodiments will be apparent to those skilled in the art in light of this disclosure. For example, the present invention may readily be implemented using configurations other than those described in the preferred embodiment above. Additionally, the present invention may effectively be used in conjunction with systems other than the one described above as the preferred embodiment, such as those systems using sensors other than PSDs when those sensors have the property of the sum of the sensing currents A and B being a constant when one variable changes freely. Therefore, these and other variations upon the preferred embodiments are intended to be covered by the present invention, which is limited only by the appended claims.

What is claimed is:

1. A sensing amplifier for input signals from a position sensitive detector, comprising:

at least one pulse width modulator for modulating the input signals; and at least one low pass filter for extracting direct current components of said modulated input signals, wherein said extracted direct current components are utilized to derive a variable duty cycle clock that is utilized by said at least one pulse width modulator when modulating said input signals.

2. The sensing amplifier of claim 1, wherein said variable duty cycle clock is derived by summing said direct current components.

3. The sensing amplifier of claim 2, wherein said summing of said direct current components includes comparing to a sum set point.

4. The sensing amplifier of claim 2, wherein said summing of said direct current components includes holding constant the sum.

5. The sensing amplifier of claim 4, wherein said holding constant the sum is accomplished by feedback circuits.

6. The sensing amplifier of claim 4, wherein said holding constant the sum is accomplished by feed forward circuits.

7. The sensing amplifier of claim 6, wherein said feed forward circuits include saving nominal digital values of parameters of said variable duty cycle clock.

8. The sensing amplifier of claim 6, wherein said feed forward circuits include switchable gain amplifiers.

9. The sensing amplifier of claim 1, wherein said pulse width modulator includes:

at least one conversion circuit for converting at least one input voltage into at least one input current, wherein said at least one input current represents said input signals; and at least two switches for alternately carrying said at least one input current, wherein said at least two switches modulate said at least one input current.

10. A method for amplifying input signals from a position sensitive detector, comprising:

pulse width modulating the input signals;

extracting direct current components of said modulated input signals using low pass filters; and utilizing said extracted direct current components to derive a variable duty cycle clock to vary the duty cycle of said modulated input signals.

11. The method of claim 10, further comprising deriving said variable duty cycle clock by summing said direct current components.

12. The method of claim 11, wherein said summing of said direct current components includes comparing to a sum set point.

13. The method of claim 11, further comprising holding constant the sum formed in said step of summing said direct current components.

14. The method of claim 13, wherein said step of holding constant the sum is accomplished by feedback circuits.

15. The method of claim 13, wherein said step of holding constant the sum is accomplished by feed forward circuits.

16. The method of claim 15, wherein said feed forward circuits include saving nominal digital values of parameters of said variable duty cycle clock.

17. The method of claim 15, wherein said feed forward circuits include switchable gain amplifiers.

18. The method of claim 10, wherein said step of pulse width modulating includes:

converting at least one input voltage into at least one input current, wherein said at least one input current represents said input signals; and modulating said at least one input current by inputting said at least one current into one of at least two switches, wherein said at least two switches alternately carry said at least one input current.

19. A sensing amplifier for input signals from a position sensitive detector, comprising:

means for pulse width modulating said input signals;

means for extracting direct current components of said modulated input signals; and means for utilizing said extracted direct current components to derive a variable duty cycle clock to vary the duty cycle of said modulated input signals.

20. The sensing amplifier of claim 19, further comprising means for compensating for dark-current.

21. The sensing amplifier of claim 20, wherein the means for compensating for dark-current comprises using a second position sensitive detector that acts as a dummy position sensitive detector.

22. The sensing amplifier of claim 20, wherein the means for compensating for dark-current comprises means for periodically sampling the current of the position sensitive detector.

* * * * *